(12) United States Patent
Ko

(10) Patent No.: US 9,412,468 B2
(45) Date of Patent: Aug. 9, 2016

(54) SEMICONDUCTOR DEVICES AND SEMICONDUCTOR SYSTEMS FOR CONDUCTING A TRAINING OPERATION

(71) Applicant: SK hynix Inc., Icheon-si Gyeonggi-do (KR)

(72) Inventor: Bok Rim Ko, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 228 days.

(21) Appl. No.: 14/312,351

(22) Filed: Jun. 23, 2014

(65) Prior Publication Data

US 2015/0263703 A1 Sep. 17, 2015

(30) Foreign Application Priority Data

Mar. 12, 2014 (KR) .................. 10-2014-0028691

(51) Int. Cl.
*H03L 7/00* (2006.01)
*G11C 29/02* (2006.01)
*G11C 7/14* (2006.01)

(52) U.S. Cl.
CPC ............ *G11C 29/028* (2013.01); *G11C 7/14* (2013.01); *G11C 29/021* (2013.01); *G11C 2207/2254* (2013.01)

(58) Field of Classification Search
CPC .......... H03K 17/22; H03K 17/26; G06F 1/24; G06F 1/26; G11C 11/40607; G11C 13/0033; H01L 29/76825
USPC ................................................. 327/141–143
See application file for complete search history.

(56) References Cited

U.S. PATENT DOCUMENTS 8,280,672 B2 * 10/2012 Kim .................. G11C 17/18
327/525
2009/0080266 A1 3/2009 Zumkehr

FOREIGN PATENT DOCUMENTS

KR 1020110050923 A 5/2011

* cited by examiner

*Primary Examiner* — Lincoln Donovan
*Assistant Examiner* — Diana J Cheng
(74) *Attorney, Agent, or Firm* — William Park & Associates Ltd.

(57) ABSTRACT

The semiconductor device includes a flag signal generator, a reference voltage generator and a first buffer. The flag signal generator generates a flag signal in response to an internal command and an information code. The reference voltage generator receives a set code in response to the flag signal, and generates a reference voltage having a voltage level regulated according to the set code. The first buffer buffers the external signal in response to the reference voltage to generate an internal signal, and generates a calibration code in response to the flag signal.

19 Claims, 6 Drawing Sheets

SEMICONDUCTOR DEVICES AND SEMICONDUCTOR SYSTEMS FOR CONDUCTING A TRAINING OPERATION

CROSS-REFERENCE TO RELATED APPLICATION

The present application claims priority under 35 U.S.C 119(a) to Korean Application No. 10-2014-0028691, filed on Mar. 12, 2014, in the Korean Intellectual Property Office, which is incorporated herein by reference in its entirety as set forth in full.

BACKGROUND

1. Technical Field

Embodiments of the invention relate to semiconductor integrated circuits and, more particularly, to semiconductor devices and semiconductor systems for conducting a training operation.

2. Related Art

Mobile systems such as portable computers, personal digital assistants (PDAs) and portable phones have been developed to reduce the weight thereof for portability. Batteries supplying electric power to the mobile systems may largely affect the total weight of the mobile systems. If power consumption of semiconductor devices employed in the mobile systems is lowered, the capacity of the batteries may also be reduced to thus decrease the total weight of the mobile systems. Fast mobile systems are increasingly in demand with the development of multi-functional mobile systems.

Accordingly, data transmission speeds of the semiconductor devices such as mobile memory devices (also, referred to as mobile memory chips) may be important factors in determination of operation speeds of the high performance mobile systems.

Recently, the semiconductor devices have been designed to simultaneously receive command signals and address signals through ten pins. In such a case, the signals inputted through the ten pins include all information on the command signals and the address signals, and a command decoder and an address decoder decode the singles inputted through the ten pins to extract the command signals and the address signals.

SUMMARY

According to an, a semiconductor device includes a flag signal generator, a reference voltage generator and a first buffer. The flag signal generator generates a flag signal in response to an internal command and an information code extracted from an external signal. The reference voltage generator receives a set code in response to the flag signal, and generates a reference voltage having a voltage level regulated according to the set code. The first buffer buffers the external signal in response to the reference voltage to generate an internal signal, and generates a calibration code in response to the flag signal.

According to an embodiment, a semiconductor system includes a controller and a semiconductor device. The controller transmits an external signal and a first data, and receives a second data. The semiconductor device generates a flag signal in response to the external signal. The semiconductor device also receives the first data as a set code in response to the flag signal to regulate a voltage level of a reference voltage. In addition, the semiconductor device buffers the external signal in response to the reference voltage to generate an internal signal. Further, the semiconductor device generates a calibration code in response to the flag signal, and outputs the calibration code as the second data.

According to an, a training method includes generating a flag signal by a flag signal generator according to an internal command and an information code extracted from an external signal. The training method may also include regulating a voltage level of a reference voltage generated by a reference voltage generator according to a set code in response to the flag signal. The training method may also include verifying a valid window of the external signal by a controller at the regulated voltage level of the reference voltage.

DETAILED DESCRIPTION

Various embodiments of the invention will be described with reference to the accompanying figures. However, the embodiments described are for illustrative purposes only and not intended to limit the scope of the invention. Various embodiments are directed to semiconductor devices and semiconductor systems including the same. In the case of synchronous semiconductor devices, the command signals and the address signals are inputted in synchronization with a clock signal. For example, double data rate (DDR) semiconductor devices receive the command signals and the address signals in synchronization with a rising edge and a falling edge of the clock signal. In addition, single data rate (SDR) semiconductor devices receive the command signals and the address signals in synchronization with a rising edge of the clock signal.

Figure 1:
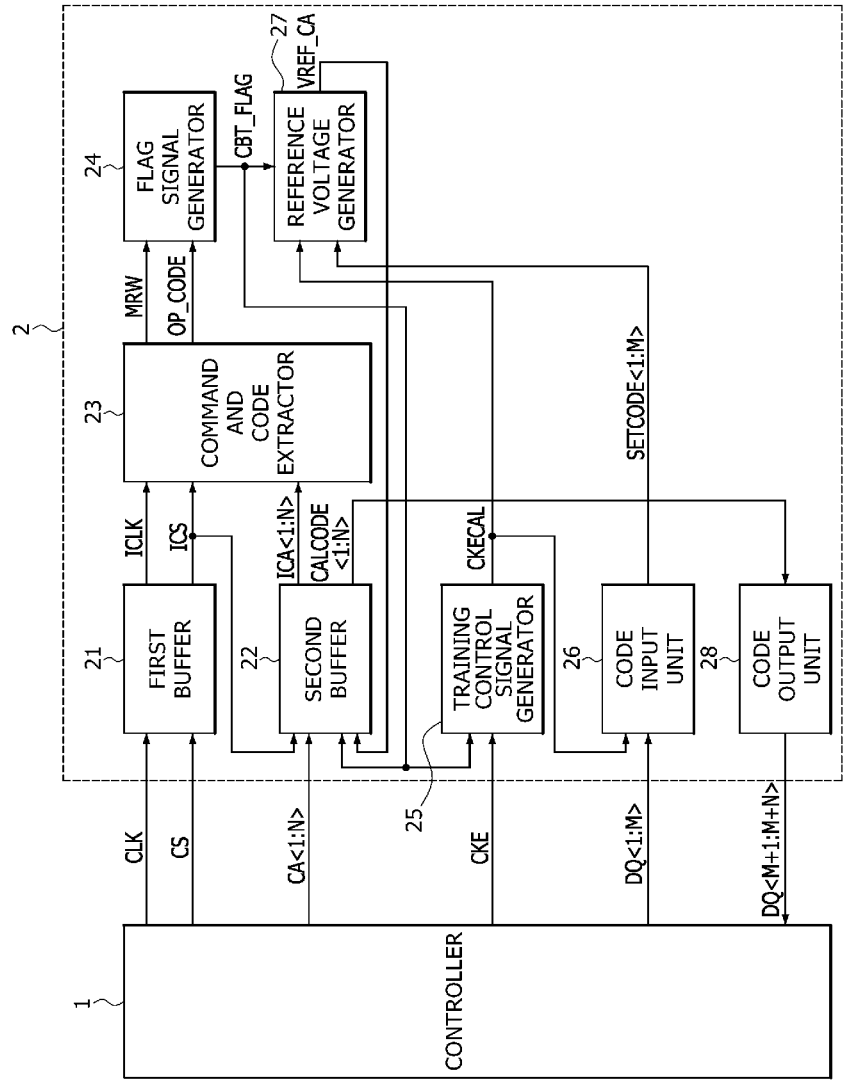
FIG. 1 is a block diagram illustrating a semiconductor system according to an embodiment of the invention.

Referring to FIG. 1, a semiconductor system may include a controller 1 and a semiconductor device 2. The semiconductor device 2 may include a first buffer 21, a second buffer 22, a command and code extractor 23, a flag signal generator 24, a training control signal generator 25, a code input unit 26, a reference voltage generator 27 and a code output unit 28.

The controller 1 may apply a clock CLK, a chip selection signal CS, an external signal CA<1:N>, a clock enable signal CKE and a first data DQ<1:M> to the semiconductor device 2. The controller 1 may receive a second data DQ<M+1:M+N> from the semiconductor device 2. The chip selection signal CS may be an external control signal enabled to select a chip including the semiconductor device 2. The external signal CA<1:N> may include at least one or both of an external command signal and an external address signal. The external signal CA<1:N> may be inputted to the semiconductor device 2 through the same lines or different lines.

The first buffer 21 may be configured to buffer the clock CLK and the chip selection signal CS to generate an internal clock ICLK and an internal chip selection signal ICS. The second buffer 22 may be configured to buffer the external signal CA<1:N> according to a reference voltage VREF_CA to generate an internal signal ICA<1:N>. The second buffer 22 may output a calibration code CALCODE<1:N> generated from the internal signal ICA<1:N> according to a flag signal CBT_FLAG. A configuration and an operation of the second buffer 22 will be described in detail in FIG. 2 and FIG. 3.

The command and code extractor 23 may be configured to extract an internal command MRW and an information code OP_CODE from the internal signal ICA<1:N> in synchronization with the internal clock ICLK when the internal chip selection signal is enabled. The internal command MRW is enabled to execute a mode register write operation that stores the information code OP_CODE in a mode register. A logic level of the internal command MRW which are enabled may also be set to be different according to various embodiments. The information code OP_CODE includes information to determine whether a training operation has to be executed. For example, the training operation has to be executed when the information code OP_CODE has a logic "high" level. In addition, the training operation has to not be executed while the information code OP_CODE has a logic "low" level. Logic levels and the number of bits of the information code OP_CODE may also be set to be different according to various embodiments. A design scheme to include the internal command MRW and the information code OP_CODE in the internal signal ICA<1:N> may be set to be different according to various embodiments. Further, a design scheme to extract the internal command MRW and the information code OP_CODE from the internal signal ICA<1:N> by the command and code extractor 23 may be set to be different according to various embodiments. For instance, the command and code extractor 23 may be configured to extract the internal command MRW and the information code OP_CODE from the internal signal ICA<1:N> irrelevant to the internal chip selection signal ICS and the internal clock ICLK according to various embodiments.

The flag signal generator 24 may be configured to store the information code OP_CODE in response to the internal command MRW. The flag signal generator 24 may be configured to generate the flag signal CBT_FLAG from the stored information code OP_CODE, and output the flag signal CBT_FLAG. The flag signal generator 24 may be designed to be a mode register to store the information code OP_CODE in response to the internal command MRW. The flag signal generator 24 may store internally the information code OP_CODE when the internal command MRW is enabled. The flag signal generator 24 may be configured to generate the flag signal CBT_FLAG in response to a logic "high" level of the information code OP_CODE. For example, the flag signal CBT_FLAG enabled to execute the training operation is generated when the information code OP_CODE has a logic "high" level. The flag signal CBT_FLAG can be enabled to have a logic "low" level according to various embodiments.

The training control signal generator 25 may be configured to generate a training control signal CKECAL in response to the flag signal CBT_FLAG and the clock enable signal CKE. More specifically, the training control signal generator 25 may generate the training control signal CKECAL enabled to have a logic "high" level in synchronization with a point of time when the flag signal CBT_FLAG is enabled, and the clock enable signal CKE has a logic "low" level. Logic levels of the flag signal CBT_FLAG, the clock enable signal CKE, and the training control signal CKECAL may also be set to be different according to various embodiments.

The code input unit 26 may be configured to receive the first data DQ<1:M> as a set code SETCODE<1:M> in response to the training control signal CKECAL. More specifically, the code input unit 26 may transfer the first data DQ<1:M> as the set code SETCODE<1:M> when the training control signal CKECAL is enabled to have a logic "high" level. The first data DQ<1:M> may be a signal transmitted through data lines between the controller 1 and the semiconductor device 2. The number of bits of the first data DQ<1:M> and the set code SETCODE<1:M> may also be set to be different according to various embodiments.

The reference voltage generator 27 may be configured to generate the reference voltage VREF_CA, and transmit the reference voltage VREF_CA to the second buffer 22. The reference voltage generator 27 may be configured to regulate a voltage level of the reference voltage VREF_CA supplied to the second buffer 22 according to the set code SETCODE<1:M> while the flag signal CBT_FLAG and the training control signal CKECAL are enabled. Logic level combinations of the set code SETCODE<1:M> regulating the voltage level of the reference voltage VREF_CA may also be set to be different according to various embodiments.

The code output unit 28 may be configured to receive the calibration code CALCODE<1:N> from the second buffer 22. In addition, the code output unit 28 may transfer the calibration code CALCODE<1:N> as the second data DQ<M+1:M+N>. The second data DQ<M+1:M+N> may be a signal transmitted through data lines between the controller 1 and the semiconductor device 2.

Figure 2:
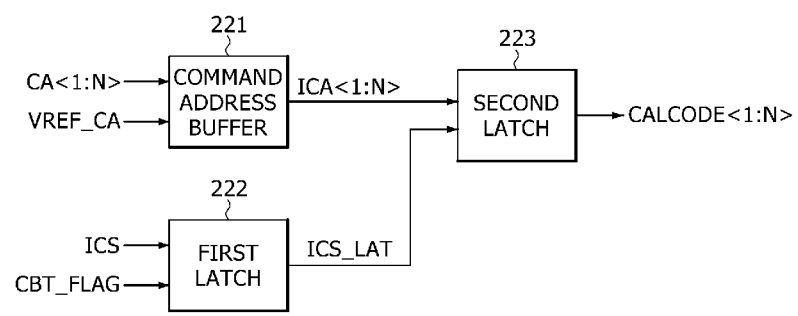
FIG. 2 is a block diagram illustrating a second buffer included in the semiconductor system of FIG. 1.

Referring to FIG. 2, second buffer 22 may include a command address buffer 221, a first latch 222 and a second latch 223. The command address buffer 221 may be configured to buffer the external signal CA<1:N> in response to the reference voltage VREF_CA to generate the internal signal ICA<1:N>. More specifically, the command address buffer 221 may drive the internal signal ICA<1:N> to have a logic "high" level when a voltage level of the external signal CA<1:N> is higher than the reference voltage VREF_CA. Further, the command address buffer 221 may drive the internal signal ICA<1:N> to have a logic "low" level when the voltage level of the external signal CA<1:N> is lower than that of the reference voltage VREF_CA. The first latch 222 may be configured to latch the internal chip selection signal ICS in response to the flag signal CBT_FLAG, and output the latched internal chip selection signal ICS to an internal latch signal ICS_LAT. The first latch 222 may generate internal latch signal ICS_LAT enabled when the internal chip selection signal ICS and the flag signal CBT_FLAG are enabled. Logic levels of the flag signal CBT_FLAG, the internal chip selection signal ICS, and the internal latch signal ICS_LAT which are enabled may also be set to be different according to various embodiments. The second latch 223 may be configured to latch the internal signal ICA<1:N> when the internal latch signal ICS_LAT is enabled. In addition, the second latch 223 may output the latched internal signal ICA<1:N> to the calibration code CALCODE<1:N>.

Figure 3:
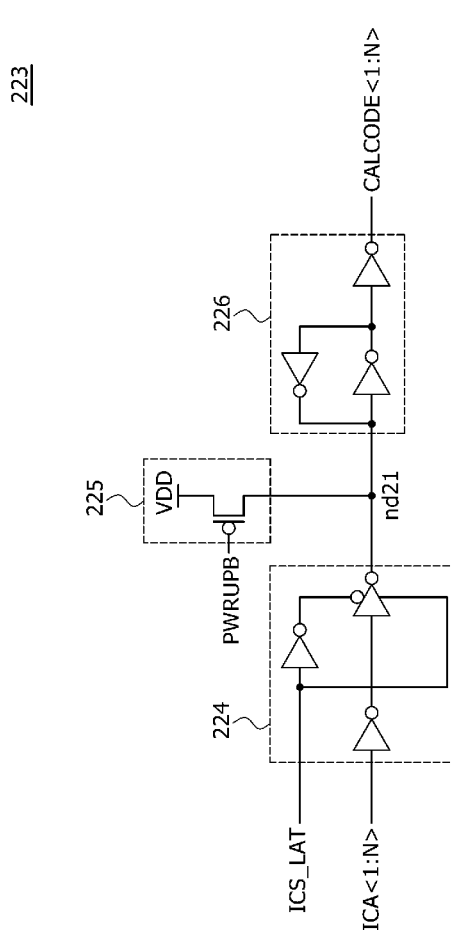
FIG. 3 is a block diagram illustrating a second latch included in the second buffer of FIG. 2.

Referring to FIG. 3, the second latch 223 may include a transfer unit 224, an initialization unit 225, and an output unit 226. The transfer unit 224 may be configured to transfer the internal signal ICA<1:N> to an output node nd21 in response to the internal latch signal ICS_LAT. More specifically, the transfer unit 224 may buffer the internal signal ICA<1:N>. In addition, the transfer unit 224 may output the buffered the internal signal ICA<1:N> to the output node nd21 while the internal latch signal ICS_LAT is enabled to have a logic "high" level. The initialization unit 225 may be configured to initialize the output node nd21 in response to a power-up signal PWRUPB. The power-up signal PWRUPB may be a signal whose level is changed from a logic "low" level to a logic "high" level when a power supply signal reaches a predetermined level after a certain period or power-up period elapses from a point of time that the power supply signal is applied to the semiconductor device 2. The initialization unit 225 may drive the output node nd21 in response to the power supply voltage signal VDD during the power-up period to initialize the output node nd21. The output unit 226 may latch and buffer a signal of the output node nd21. The output unit 226 may also output the latched and buffered signal as the calibration code CALCODE<1:N>.

The training operation of the semiconductor system having the aforementioned configuration will be described with reference to FIG. 4.

Figure 4:
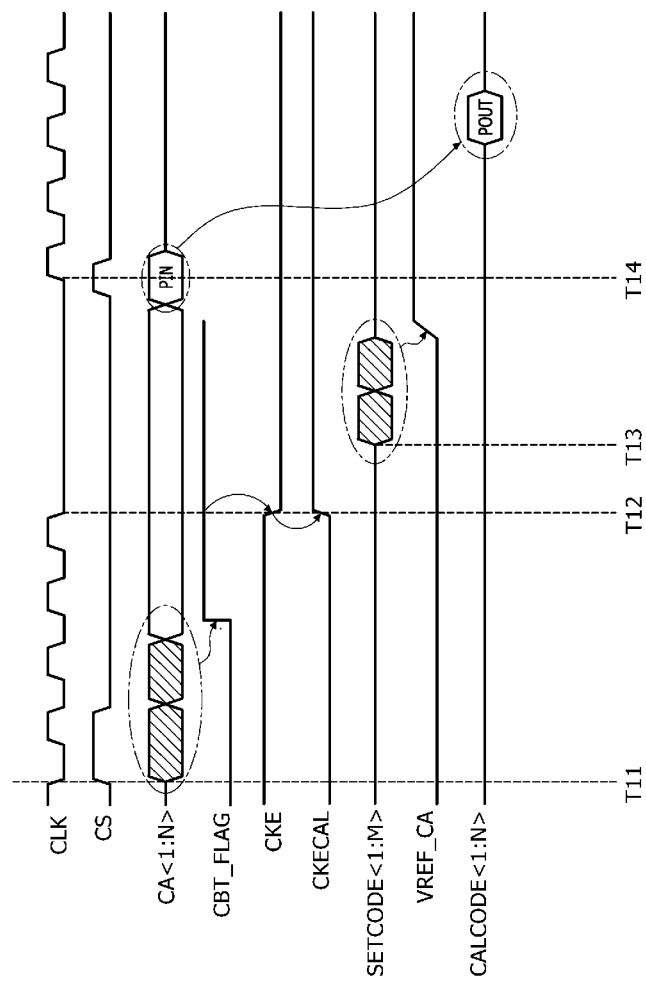
FIG. 4 is a timing diagram illustrating a training operation of the semiconductor system illustrated in FIG. 1.

Referring to FIG. 4, at a point of time "T11," the flag signal CBT_FLAG enabled to have a logic "high" level is generated in synchronization with the clock CLK and the chip selection signal CS. A detailed description of generating the flag signal CBT_FLAG will be omitted because of the detailed description in FIG. 1.

At a point of time "T12," the training control signal CKE-CAL is enabled to have a logic "high" level when the flag signal CBT_FLAG is enabled to a logic "high" level, and the clock enable signal CKE is changed from a logic "high" level into a logic "low" level.

At a point of time "T13," the set code SETCODE<1:M> is inputted according to the training control signal CKECAL enabled to have a logic "high" level. In addition, a voltage level of the reference voltage VREF_CA is regulated according to a logic level of the set code SETCODE<1:M>.

At a point of time "T14," the external signal CA<1:N> including a first pattern data PIN is inputted when the chip selection signal CS is inputted in synchronization with a rising edge of the clock CLK. The external signal CA<1:N> is buffered by the reference voltage VREF_CA having a pre-regulated voltage level. Further, the buffered external signal CA<1:N> may be outputted as the calibration code CALCODE<1:N>. The controller 1 may repeat comparison between the first pattern data PIN and a second pattern data POUT included in the calibration code CALCODE<1:N> to check a valid window of the chip selection signal CS and a valid window of the external signal CA<1:N>. In addition, the controller 1 may store information on valid windows.

More specifically, the valid window of the chip selection signal CS may be verified by repeatedly confirming a period where the first pattern data PIN and the second pattern data POUT are equally inputted in response to the pulse of the chip selection signal CS when a generation timing of the pulse of the chip selection signal CS inputted in synchronization with a rising edge of the clock signal CLK is sequentially changed in a predetermined period. In addition, the valid window of the external signal CA<1:N> may be verified by repeatedly confirming a period where the first pattern data PIN and the second pattern data POUT are equally inputted according to a pulse of the chip selection signal CS while an input timing of the external signal inputted in synchronization with the pulse of the chip selection signal CS is sequentially changed within a predetermined period.

An operation executed to verify valid windows of the chip selection signal CS and the external signal CA<1:N> will be described more fully with reference to FIG. 5.

Figure 5:
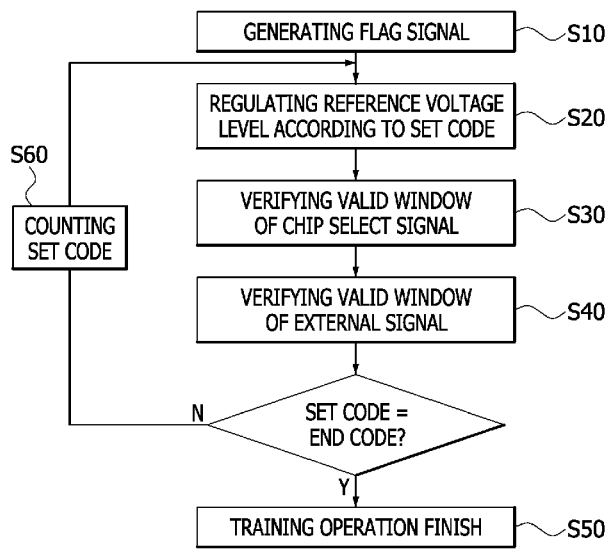
FIG. 5 is a flow chart illustrating a training operation of the semiconductor system illustrated in FIG. 1.

Referring to FIG. 5, if the flag signal CBT_FLAG which is enabled to execute the training operation is generated (see the step S10), a voltage level of the reference voltage VREF_CA is regulated according to a logic level of the set code SET-CODE<1:M>(see the step S20).

Next, the valid window of the chip selection signal CS may be verified by repeatedly confirming a period that the first pattern data PIN and the second pattern data POUT are equally inputted. The period may include where a generation timing of the pulse of the chip selection signal CS is sequentially changed at the regulated voltage level of the reference voltage VREF_CA (see the step S30).

In addition, the valid window of the external signal CA<1:N> may be verified by repeatedly confirming a period that the first pattern data PIN and the second pattern data POUT are equally inputted. The period may include where an input timing of the external signal CA<1:N> inputted in synchronization with the pulse of the chip selection signal CS is sequentially changed at the regulated voltage level of the reference voltage VREF_CA (see the step S40).

Next, if the set code SETCODE<1:M> is equal to a predetermined end code, the training operation may finish (see the step S50). If the set code SETCODE<1:M> is not equal to the predetermined end code, the set code SETCODE<1:M> is counted (see the step S60), and the steps S20, S30 and S40 is executed repeatedly on the basis of the counted set code SETCODE<1:M> until the set code SETCODE<1:M> is equal to the predetermined end code. For example, if the set code SETCODE<1:M> is counted $2^M$ times, the voltage level of the reference voltage VREF_CA is then regulated $2^M$ times. In addition, valid windows of the chip selection signal CS and the external signal CA<1:N> may be verified on the basis of the regulated voltage level of reference voltage VREF_CA.

Figure 6:
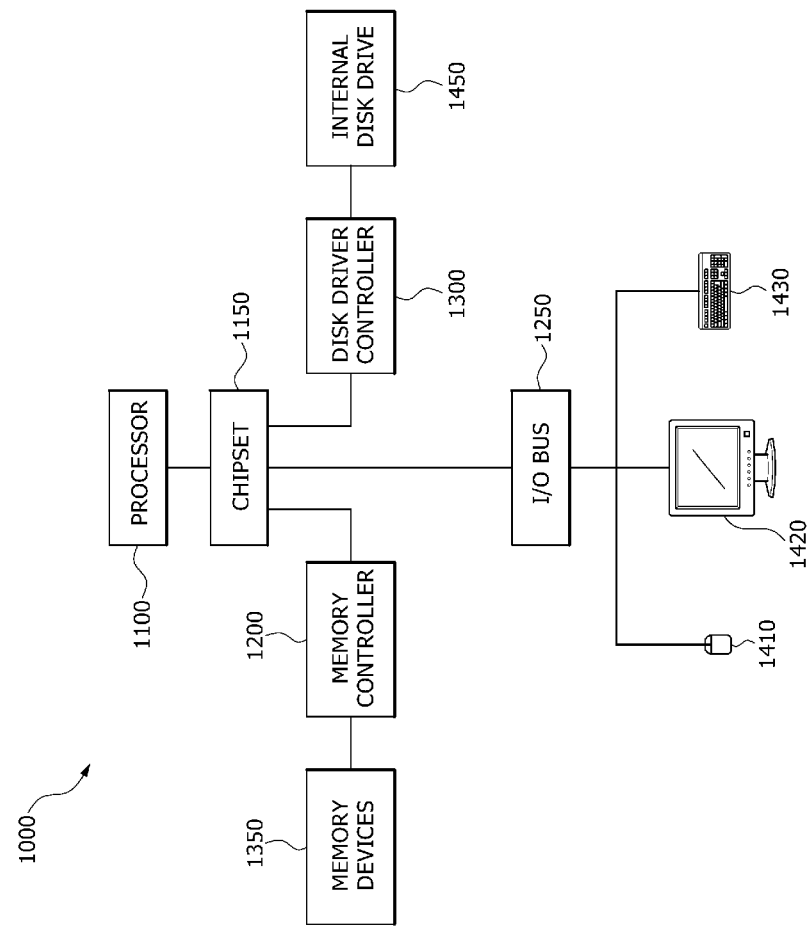
FIG. 6 illustrates a block diagram representation of a system employing the semiconductor system in accordance with the embodiments discussed above with relation to FIGS. 1-5.

The semiconductor system discussed above is particular useful in the design of memory devices, processors, and computer systems. For instance, referring to FIG. 6, a block diagram of a system employing the semiconductor system in accordance with various embodiments are illustrated and generally designated by a reference numeral 1000. The system 1000 may be configured to include one or more processors or central processing units ("CPUs") 1100. The processor 1100 may be used individually or in combination with other processors. While the processor 1100 will be referred to primarily in the singular, it will be understood by those skilled in the art that a system with any number of physical or logical processors may be implemented.

A chipset 1150 may be electrically coupled to the CPU 1100. The chipset 1150 is a communication pathway for signals between the CPU 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150. In addition, those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 may include at least one semiconductor system as discussed above with reference to FIGS. 1-5 or controller (i.e., as shown in FIG. 1). Accordingly, the memory controller 1200 can receive a request provided from the CPU 1100, through the chipset 1150. In various embodiments, the memory controller 1200 may be integrated into the chipset 1150. The memory controller 1200 may be electrically coupled to one or more memory devices 1350. In an embodiment, the memory devices 1350 may include the semiconductor system as discussed above with relation to FIGS. 1-5 or semiconductor device 2 (i.e., as shown in FIG. 1). Further, the memory devices 1350 may include a plurality of word lines and a plurality of bit lines for defining a plurality of memory cell.

The memory devices 1350 may be any one of a number of industry standard memory types. The industry standard memory types may include but are not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ a number of communications protocols to communicate with the I/O devices 1410, 1420, and 1430. In addition, the I/O bus 1250 may be integrated into the chipset 1150.

The disk drive controller 1450 (i.e., internal disk drive) may also be electrically coupled to the chipset 1150. The disk drive controller 1450 may be configured to serve as the communication pathway between the chipset 1150 and one or more internal disk drives 1450. The internal disk drive 1450 may be configured to facilitate disconnection of the external data storage devices by storing both instructions and data. The disk drive controller 1300 and the internal disk drives 1450 may communicate with each other or with the chipset 1150 using virtually any type of communication protocol. Moreover such communication protocols may include all of those mentioned above with regard to the I/O bus 1250.

It is important to note that the system 1000 described above in relation to FIG. 6 is one example of a system employing the semiconductor system as discussed above with relation to FIGS. 1-5. In various embodiments, such as cellular phones or digital cameras, the components may differ from the embodiments shown in FIG. 6.

What is claimed is:

1. A semiconductor device comprising:
   a flag signal generator suitable for generating a flag signal in response to an internal command and an information code extracted from an external signal;
   a reference voltage generator suitable for receiving a set code in response to the flag signal, and generating a reference voltage having a voltage level regulated according to the set code; and
   a first buffer suitable for buffering the external signal in response to the reference voltage to generate an internal signal, and generating a calibration code in response to the flag signal.

2. The semiconductor device of claim 1, wherein the external signal includes at least one of an external command signal and an external address signal.

3. The semiconductor device of claim 1, wherein the set code is inputted from a controller.

4. The semiconductor device of claim 3, wherein the calibration code is outputted to the controller.

5. The semiconductor device of claim 1, further comprising:
   a second buffer suitable for buffering a clock and a chip selection signal to generate an internal clock and an internal chip selection signal.

6. The semiconductor device of claim 5, wherein the first buffer includes:
   a first latch suitable for latching the internal chip selection signal in response to the flag signal to generate an internal latch signal; and
   a second latch suitable for generating the calibration code in response to the internal latch signal.

7. The semiconductor device of claim 6, wherein the second latch includes:
   a transfer unit suitable for outputting the internal signal to an output node in response to the internal latch signal; and
   an initialization unit suitable for initializing the output node in response to a power-up signal.

8. The semiconductor device of claim 1, further comprising:
   a training control signal generator suitable for generating a training control signal in response to the flag signal and a clock enable signal.

9. The semiconductor device of claim 8, further comprising:
   a code input unit suitable for receiving a first data as the set code in response to the training control signal, wherein the reference voltage generator regulates a voltage level of the reference voltage by the set code when the flag signal and the training control signal are enabled.

10. A semiconductor system comprising:
    a controller suitable for transmitting an external signal and a first data and receiving a second data; and
    a semiconductor device suitable for generating a flag signal in response to the external signal, receiving the first data as a set code in response to the flag signal to regulate a voltage level of a reference voltage, buffering the external signal in response to the reference voltage to generate an internal signal, generating a calibration code from the internal signal in response to the flag signal, and outputting the calibration code as the second data.

11. The semiconductor system of claim 10, wherein the semiconductor device includes:
    a flag signal generator suitable for generating the flag signal in response to an internal command and an information code extracted from the external signal;
    a reference voltage generator suitable for receiving the set code in response to the flag signal and generating the reference voltage with a voltage level regulated according to the set code; and
    a first buffer suitable for buffering the external signal in response to the reference voltage to generate the internal signal and generating the calibration code from the internal signal in response to the flag signal.

12. The semiconductor system of claim 11, further comprising:
    a second buffer suitable for buffering a clock and a chip selection signal to generate an internal clock and an internal chip selection signal.

13. The semiconductor system of claim 12, wherein the first buffer includes:
    a first latch suitable for latching the internal chip selection signal according to the flag signal to generate an internal latch signal; and
    a second latch suitable for generating the calibration code in response to the internal latch signal.

14. The semiconductor system of claim 13, wherein the second latch includes:
    a transfer unit suitable for outputting the internal signal to an output node according to the internal latch signal; and
    an initialization unit suitable for initializing the output node in response to a power-up signal.

15. The semiconductor system of claim 11, further comprising:
    a training control signal generator suitable for generating a training control signal according to the flag signal and a clock enable signal.

16. The semiconductor system of claim 15, further comprising:
a code input unit suitable for receiving a first data as the set code in response to the training control signal, wherein the reference voltage generator regulates a level of the reference voltage by the set code when the flag signal and the training control signal are enabled.

17. A training method comprising:
generating a flag signal by a flag signal generator according to an internal command and an information code extracted from an external signal;
regulating a voltage level of a reference voltage generated from a reference voltage generator according to a set code in response to the flag signal; and
verifying a valid window of the external signal by a controller at the regulated voltage level of the reference voltage,
wherein verifying the valid window of the external signal includes:
buffering the external signal including a first pattern data according to the reference voltage to generate an internal signal;
generating a calibration code from the internal signal in response to the flag signal; and
comparing a second pattern data included in the calibration code with the first pattern data.

18. The training method of claim 17, further comprising:
verifying whether the set code is equal to an end code; and
counting the set code.

19. The training method of claim 18, further comprising:
regulating the voltage level of the reference voltage from the counted set code; and
verifying the valid window of the external signal at the regulated voltage level of the reference voltage.

\* \* \* \* \*